United States Patent [19]

Bergmann et al.

[11] Patent Number: 4,946,747
[45] Date of Patent: Aug. 7, 1990

[54] MACHINE ELEMENT AND METHOD OF MAKING

[75] Inventors: Erich Bergmann, Mels; Manfred Berger, Gofis, both of Austria

[73] Assignee: Balzers AG, Fürstentum, Liechtenstein

[21] Appl. No.: 186,589

[22] Filed: Apr. 27, 1988

[30] Foreign Application Priority Data

Apr. 30, 1987 [CH] Switzerland ............... 01668/87

[51] Int. Cl.$^5$ ............................................. B32B 15/01
[52] U.S. Cl. ...................... 428/653; 384/912; 427/250; 427/318; 427/327; 428/614; 428/677; 428/925; 428/938
[58] Field of Search ............... 428/609, 610, 614, 653, 428/677, 925, 938; 384/912; 427/250, 318, 327

[56] References Cited

U.S. PATENT DOCUMENTS 2,285,583  6/1942  Jennings et al. ............... 428/609
2,586,099  2/1952  Schultz ............................ 428/653
2,715,259  8/1955  Mohler ............................ 428/653

FOREIGN PATENT DOCUMENTS 2935417  3/1981  Fed. Rep. of Germany ...... 428/653
139540  10/1980  Japan ................................... 428/609
43865  3/1984  Japan ................................... 428/653
1289678  9/1972  United Kingdom ............... 428/653

Primary Examiner—Robert McDowell
Attorney, Agent, or Firm—McGlew & Tuttle

[57] ABSTRACT

Machine elements formed which overcome the problems associated with rolling bearings or rolling drive units, which, apart from load under rolling are simultaneously exposed to frictional load, which leads in particular zones to frictional wear. In order to keep this to a minimum the invention teaches to apply on the effected surfaces of such structural parts a coating of a friction bearing material, which, however, according to the findings of the invention must be applied with the PVD method and must have a thickness of the order of magnitude of the surface roughness of the base body; known thicker friction bearing coatings are not suitable. The invention is especially for forming gear wheels, rolling bearings, shafts, compressor screws, and rolling pistons.

19 Claims, 3 Drawing Sheets

MACHINE ELEMENT AND METHOD OF MAKING

FIELD OF THE INVENTION

Background Of The Invention

The invention relates to a rolling elements such as roller-bearings, races, cylinders, gear elements and the like, which is exposed primarily to stress under rolling, which consists of a base material, which resists the stress under rolling, and at least one coat of a material, normally employed in the friction bearing field applied on it.

The construction and material selection for machine elements has advanced considerably in recent years by practices such as exposing functional surfaces of the rolling element substantially to stress under rolling, like the gear wheels of gearings or the components of ball and needle bearings. Through decades of optimizing geometry, material selection, heat treatment, and finishing techniques, wear-resistant products have been produced, which can be manufactured within acceptable cost limits. The main problem of earlier machine elements, that of fatigue wear, can be considered solved. Another problem of rolling body wear, however, could not be solved. In all rolling bearings or rolling motions in addition to the roll motion, a slide motion also occurs. This leads to friction wear in particular zones of the structural parts such as the regions of positive and negative slip of gear wheels, slip of shoulders of the race and slip of ball bearings. The zones and the stresses occurring there are generally known to the builder of conventional machine elements. Such a builder will also appreciate many effect factors, which influence this microwear, such as: inner stress from heat treatment and processing, the kind and extent of surface roughness, and the lubricating conditions. A further problem with rolling bodies occurs, if the mean wear problem is solved by selecting two very hard components. The relative motion of the two hard components is always accompanied by two considerable stored elastic deformation forces, which with weak damping, lead to vibrations. This is familiar to all users of machines equipped with rolling bearings as noise. In some applications, medical technology, passenger vehicles, etc.. this noise is disturbing to intolerable. A solution within the frame of the state of the art could not be found until now.

Many attempts have been carried out to solve the known problems by applying coatings. For a variety of reasons these attempt have all failed. Sometimes, gear parts and gear wheels were galvanically or current-less nickel and chromium-plated. Hydrogen embrittlement of the base material is the result and the much more decisive resistance against fatigue wear is lost. Also coats of copper, indium, lead, and silver applied with PVD methods were tried. Unfortunately, these coats of lead, silver, gold and indium under conditions of normal use, wear rapidly through tribooxydation. In high vacuums lead, silver and gold coats are used, however, they are only used for very highly polished surfaces and in configurations with very little frictional motion. In that case, very thin coats suffice. A solution of the noise problem is, however, not presented by these coats. Copper layers are also not suitable for lubricated gears because copper abrasions degrade all oils catalytically.

It has also ben suggested to coat pure friction bearings according to the PVD method with different materials (see German patents No. 28 53 724 and 29 14 618, as well as German Published Application No. 34 04 880). Here the PVD technique was used to improve the hot hardness of bearing coats with oxide embeddings. Such coats are used today in friction bearings in engines (cf. U. Engle, Development and testing of new multi-layer materials for modern engine bearings, part 2- Copper-lead-three-layer bearings with sputtered overly, in SAE Technical Paper Series, Int. Congress and exposition, Detroit, Feb. 24 to 28, 1986, pages 76 and 77). In the past, however, it has always been shown that such friction bearing material coatings are unfit for stress under rolling. In fact, while for decades nearly all friction bearings used in technology have had coatings, practically no coated rolling bodies are used.

SUMMARY AND OBJECTS OF THE INVENTION

It is an object of the invention to improve structural parts, in particular rolling elements such as roller bearings, races, cylinders, gear elements and the like, which primarily are subjected to stress under rolling but also frictional stress, that not only withstand rolling wear but also frictional wear.

According to the invention, this task is solved by the fact that, on the functional surface of rolling elements subjected to frictional stress at least one PVD coating of a friction bearing material is applied, the thickness of which is of the same order of magnitude as the mean vertical height of surface irregularities of the basic body, it is achieved for the first time that at simultaneous stress under rolling and frictional stress the wear is kept to a minimum. The inventive tasks, however, cannot-as was pointed out-be solved simply through any given frictional bearing material coat, such tasks require the specific features of a friction bearing material deposited according to the PVD method. The term friction bearing material as used in the present specification refers exclusively to alloys. The coat thickness of the bearing material deposited must be of the same order of magnitude as the mean vertical height of surface irregularities since otherwise the carrying ability of the coat for the stress under rolling is no longer sufficient.

The suitability of the friction bearing material coats applied in the PVD method is surprising per se and given only when the coat thickness is of the same order of magnitude as the surface roughness. In the mentioned known friction bearing coats a coat thickness is always used, which is at least one order of magnitude above the surface roughness.

With frictional stress considerable, heat development occurs. Until now this was considered one of the main reasons for the . rapid wear of the rolling body functional surfaces. Local loss of the mechanical properties of the body was associated with such a temperature increase, due to exceeding the tempering temperature. If, however, the embedded component of the frictional bearing material has a melting point, which lies below such critical temperature, for example, the tempering temperature of the material, of which the structural part or its surface-hardened edge zone consists, the mentioned deterioration of the mechanical properties can be avoided. For example as embedded friction materials lead (melting point 327.4° C.), tin (melting point 231.89° C.), zinc (melting point 419.4° C.) or indium (melting point 156.4° C.) or their alloys can be used. Aluminum and copper alloys have proven useful as a matrix and the matrix may be an alloy including chromium, nickel and magnesium.

It is known that with multiphase friction bearing material coats the fineness of the distribution significantly influences the mechanical properties of the coat, in particular its hardness. In a particular form of the invention for given stresses where particularly high carrying ability is demanded, coats, in which the diameter of the particles of the embedded material has a statistical normal distribution with a mean of $x \leq 0.8$ μm, are selected. For lesser stresses, as well as with rolling bodies, which are not edge zone-hardened, softer, coats have proven to be more useful. Developing this degree of freedom is known to the expert, optimum hardness curves for edge coats have been published for numerous rolling bodies. In some cases the expenditure of generating hardness gradients in the friction bearing material cost will be worthwhile. The methods for this purpose have in the meantime in principle become known to the expert. The composition may be varied, embedded hard substances (according to German Patent No. 28 53 724) or for example by way of the coating temperature change the average size of the embedded particles (according to the Swiss Patent Application No. 02806/86-2). Instead of hardness gradients one can also select a sequence of coats with different mechanical properties, but one of them should be a friction bearing material coat applied according to the PVD method.

The significance of the choice of the proper coat thickness has already been pointed out. The relationship between optimum coat thickness and surface roughness depends, of course, on the kind of surface irregularities. It is know that for the tribologically relevant characterization of surface microgeometries a large number of parameters are required. The practitioner would orient himself by the last processing step, thus, for example, differentiating between milled, planed, and ground gear slopes. He will select the ratio of coat thickness to $R_z$, the irregularities peak; values in the range of 0.2 to 4 times the $R_z$ have proven useful.

Among the PVD methods for applying friction bearing material coats thermal vaporization, cathode sputtering and light arc vaporization have proven particularly useful. Selection, in the individual case, depends on coat composition, the shape of the basic body, and the economically justifiable expenditures. Extensive literature regarding this topic is available (cf. E. Bergmann and J. Vogel: Structural part coating according to the PVD method" VDI Bericht 624, 1986). The invention can be used with all machine elements, which are primarily exposed to stress under rolling. Mentioned in particular are gear wheels, races of ball bearings, bearing surfaces of needle bearings, compressor screws, as well as rolling and rotary piston.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the drawings:

FIG. 1b is a cross-sectional view taken of a surface portion of the gear wheel of FIG. 1a;

DESCRIPTION OF THE PREFERRED EMBODIMENTS

Figure 1A:
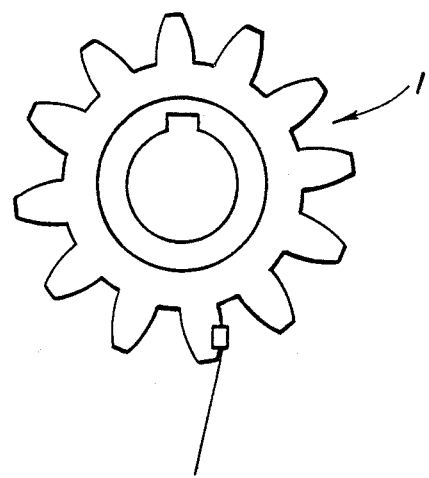
FIG. 1a is a top plan view showing a gear wheel according to the invention.

Referring to the drawings in particular, the invention embodied therein, comprises a machine element which is adapted to be subjected to stress under rolling and also stress under friction. The structural part 1 includes a body portion having surface irregularities. A friction bearing material coating is applied by a PVD method so as to provide a friction bearing material coat on the structural part body having a thickness of the same order of magnitude as the thickness of the surface irregularities of the structural part body.

In the example of FIG. 1a a gear wheel was produced of casehardened steel and subsequently again contour-ground. This generated on the slopes of the gear wheel a characteristic surface irregularities as is shown roughly in FIG. 1b. The thickness of the applied coats 6 was so selected that it is of similar order of magnitude as the greatest peaks 4 of the carburized base material 2. FIG. 1c shows an enlarged view of the composite of tough base material 2 and the rolling wear edge zone 3 with the embedded primary carbides 5 and the overlying AlSn20Cu coat 6 with the extremely finely distributed tin droplets 7 in the aluminum alloy matrix 8. Preparation of the coat can be carried out in a cathode sputtering arrangement known per se, in which an annular dense plasma is concentrated immediately in front of the cathode by a magnetic field. The installation shown in the example has a cylindrical processing chamber, at the inside of which up to a maximum of four sources of 322.6 cm² area could each be vertically mounted. The substrates to be coated were also placed vertically on a carrier, which could be rotated with a drive unit regulatable between 0.2 and 24.5 rpm (cf. for example BALZERS Product informations BB 800 246 PD/Aug. 1985, as well as, BB 800 039 RD/July 1985).

Figure 1B:
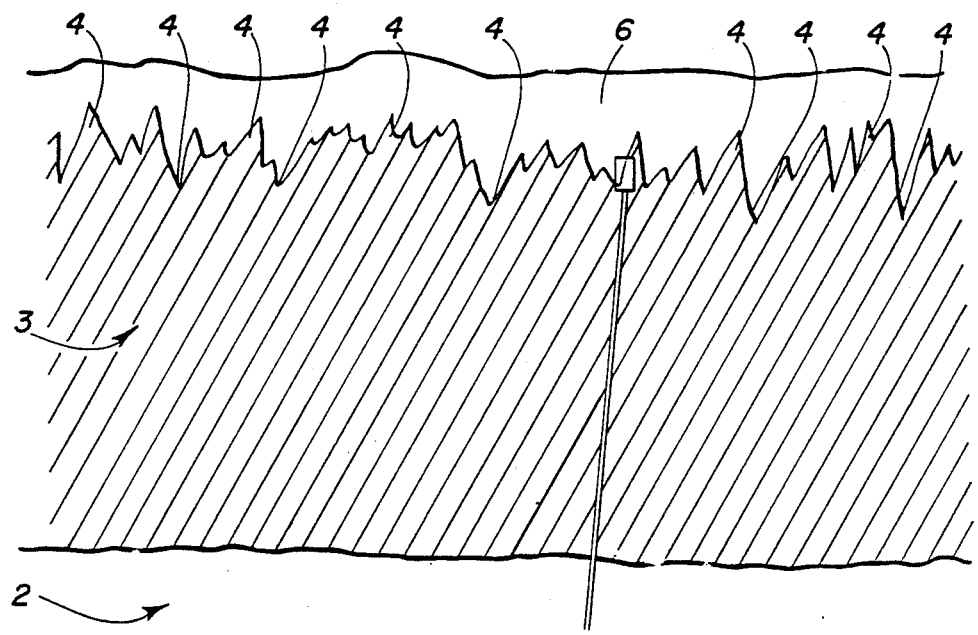
Figure 1C:
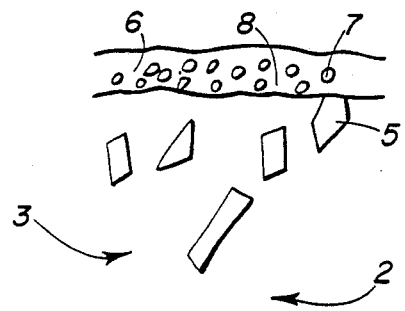
FIG. 1c is a cut-out enlarged view of a wear edge zone with overlying coating portion.

The working surface of the gear wheel shown in FIG. 1b was coated in a sputtering installation at a pressure of 1.2 Pa in an argon atmosphere in the complete absence of oxygen for 10 minutes.

As targets during sputtering 3 targets of an aluminum/tin bronze of the composition AlSn20Cu were used at a voltage of 800 Volt and driven with a current of 20A. At a rotation of the gear wheel at constant rotational speed of 15 rotations per minute a coating rate of about 0.6 μm/minute corresponding to a coating thickness of about 6 μm was obtained at the completion of the treatment process.

The coating generated in this manner had a weight ratio of Al:Sn:Cu of 80:20:1 (corresponding to the composition AlSn20Cu) and an oxide content of less than 0.2 percent by weight. The average particle diameter was about 0.3 μm and the hardness was 113 HV 0.002.

Figure 2A:
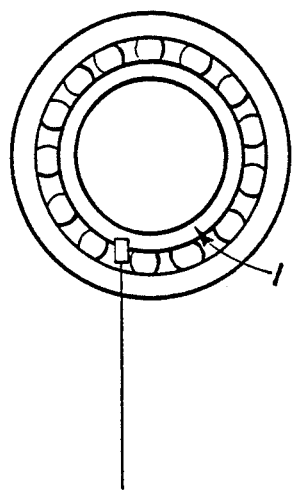
FIG. 2a is a top plan view of a ball bearing race according to the invention.
Figure 2B:
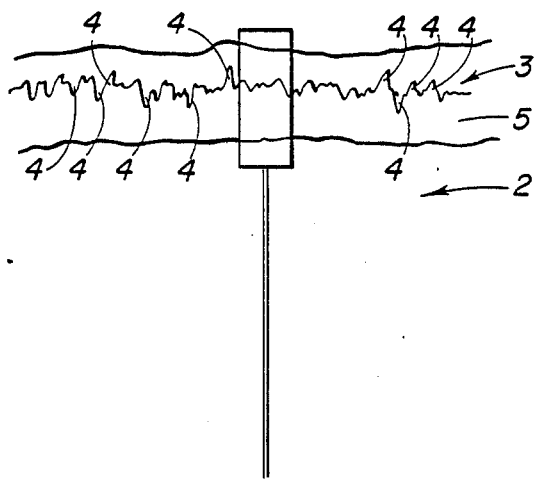
FIG. 2b is an enlarged view of an enlarged coated surface portion of the race shown in FIG. 2a; and, FIG. 2c is a cut-out enlarged view of the composite wear edge zone and the overlying coated portion.
Figure 2C:
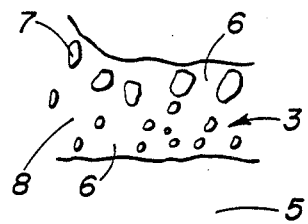
Figure 2C:
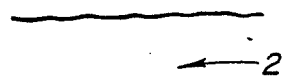

As a further example FIG. 2a shows the model of a ball bearing inner race 1 with a coating applied on it according to the invention. In this case the race is finely polished with diamond paste center-less which yields the surface structure with characteristic uniform roughness 4 shown in illustration 2b. Further details can be seen in FIG. 2c. Above the steel base material 2 a hard material coat further increasing rolling wear resistance, was applied and above a coat of AlSn10Pb10Cu 3, in which the particle size of the tin deposits 6, as well as the lead deposits 7 in the aluminum matrix 8 increases and, hence, generates a hardness decrease toward the surface.

A fourth example involves the solution of a wear problem in a ball bearing and, in particular, an end journal bearing with 60 mm race diameter. It consists of 12 balls having a diameter of 9.4 mm and a cage of a nickel beryllium alloy and was used under the following conditions: 700 rotations per minute, 20 kg axial load, no oil feed.

The races of this ball bearing were manufactured of 100 Cr6, hardened, and tempered at 190° C. In a last step the running surface was polished, and, in particular, to a mean roughness depth of 0.2 $\mu$m. Subsequently the races were coated in a method similar to example 1. As alloy for the targets, however, AlSn10Pb10 was used and the coating time was only 1 minute. This was sufficient in order to deposit on the ball bearing rolling surface a coat of 0.3 $\mu$m. The parts were additionally heated during the coating so, that the temperature during the coating increased from 8° C. to 170° C. The raster electron microscope showed a particle size of embedded lead and tin, which was smaller in the region of the steel surface by 0.05 $\mu$m while in the region near the surface a marked segregation was visible. From comparison measurements on test bodies it is known that the hardness of the coat near the steel surface had to be in the range of 140 Hv and the sink in the region near the surface to 30 Hv. While uncoated ball bearings showed already after 20 minutes heavy wear in the test, which became noticeable in the form of noise and strong vibrations, coated ball bearings run for 24 hours without any increase in the noise level.

A fifth example pertains to the problem of the manner in which the unbearable noise development of passenger car gears at high speeds can be reduced. In a given gear the sound emission under strong load in fourth gear was 18 decibels. The gear was manufactured of case-hardened 16 Mn Cr5. The toothing was milled and had on it slopes a surface irregularities with an $R_z$ of 10 $\mu$m. Coating by cathode sputtering was out of the question for reasons of cost. Therefore, an ion plating method was chosen as it is mentioned, for example, in Swiss Patent No. 64 51 37 but with two electron beam vaporizers. Onto the tooth slopes of the wheels a coating of 18 $\mu$m was applied. The vaporizer power in the crucible with tin was selected relative to the crucible with aluminum so that on the parts, which were on a carousel, a coating with a mass ratio of aluminum to tin of approximately 4:1 was obtained. For the remainder, the characteristics corresponded to the coating of example 1, except that, due to the increased plasma density, a temperature of 120° C. could be permitted. In a gear of the type in question, in which only the drive wheel of the fourth gear was coated, a decrease of the noise level to 16 decibel could be achieved.

In a sixth example, the issue again was a ball bearing wear problem, which occurred in a high-speed ball bearing, which is used in the control gyroscopes aircraft. In order to avoid wear in these ball bearings, balls of hard metal are used, and specifically of a tungsten carbide/colbalt alloy, which in general is not subject to wear. The wear of the rolling surface also, in general, is within the range of tolerance. In 1% of the bearings in operation, however, premature failure occurred. Damage analysis established that be traced back to friction wear, the cause of which lies in strong accelerations. The balls of these bearings had surface irregularities $R_z$ of 0.02 $\mu$m. They were coated similarly to example 1, with the exception that the installation was equipped with copper, one lead, and one tin target. The balls were not cooled. After three minutes a cost of 0.06 $\mu$m had formed on them which in terms of composition corresponded to CuZn20Pb10. Investigations under the transmission electron microscope showed that the coat consisted of very fine embedded lead/tin particles and a brass matrix. Ball bearings equipped with balls coated in manner showed no failure at all.

The following seventh example shows how-with the composite material according to the invention-the problem of a rolling piston pump, which must be driven unoiled in order to transport pure gases, can be solved. Wear developes rapidly in these pumps on the rolling surfaces, which leads to scoring. In order to eliminate the problem, the following solution was chosen:

The rolling surfaces of the piston were nickel-plated according to a method customary in the trade, and, in particular, with a coat thickness of 16 $\mu$m. Following the nickel-plating, which brought about slight improvement but not a solution of the problem, the rolling surfaces had surface irregularities of $R_z=2$ $\mu$m with buckled structure characteristic for chemical nickel. The coating method of choice was again cathode sputtering and the process was carried out in a matter similar to example 1. In this application, however, two targets of aluminum and two targets of tin were chosen. The discharge currents on the targets were changed continuously during the coating, and specifically as follows:

| Time | Total Discharge Current Aluminum Targets | Total Discharge Current Tin Targets |
| --- | --- | --- |
| 0-5 minutes | 40 A | 0 |
| 5-40 minutes | 40 A | increasing from 0 to 30 A |

The obtained coat thickness was 6 $\mu$m. The temperature of the parts was maintained at below 50° C. by cooling so that again an extremely fine distribution of tin droplets in an aluminum matrix could be observed, except the thickness of the tin particles increased toward the surface. The mean diameter also increased somewhat, and, specifically, from 0.4 $\mu$m to 0.9 $\mu$m. Rolling piston pumps with functional surfaces treated in this manner could be operated over longer periods of time without problems of scoring occurring.

In an eighth example the problem is the wear of the shaft on a bicycle. The suspension of the front wheel in this case is of the nature that the balls run on the shaft held fixedly by the forks. The outer race of this ball bearing forms hub of the bicycle. This suspension is often under load a strong incline, which leads to a deflection of the balls from the central race track and effects a superimposed friction motion under high Hertzian stress, which exceeds the carrying ability of the grease. Mixed friction results and, consequently, visible adhesion wear on the shaft. In the model, the problem of which was solved with the coating, these shafts of turned 100 Cr6 were hardened and tempered at 180° C. Turning leaves slight denting which on the generating surface of the cylinder corresponds to a surface roughness of $R_z=6$ μm, while on the circumference an Ra of 0.6 μm is measured. These shafts were coated on all sides according to the cathode sputtering method with a 2.1 μm thick coating of the following composition: copper 73%, lead 23%, tin 4%.

These are percentage weights. The substrate temperature in this coating was not controlled. It may have been in the range of 60° C. to 120° C. The coats were checked under the optical microscope at 200 times magnification, and no lead deposits of any kind were detected as they are otherwise characteristic for this material in sintered or cast form. In operation, it was found that in shafts coated in this manner the rolling friction coefficient does not increase even after 2000 km.

Lastly, a ninth example shows the solution of the problem of wear of the rotors of screw compressors, so-called compressor screws. These compressors are of two different types, synchronized as well as driven. In fully synchronized screws a nearly pure rolling motion occurs. In driven ones a friction motion is so provided that through this sliding with the corresponding friction the force transmission necessary for driving is intended to take place. The advantage of this system are the low costs; the disadvantage: the wear tied to the friction in the slop region of the slopes. The two rotors of such a compressor were produced of 100 Cr6. In dry operation, which is necessary for the compression of pure gases, without coating an operating life of 16 hours is given. The surfaces of these rotors were contour-ground, so that a surface roughness of $R_z=0.8$ μm was obtained. As the method of coating cathode sputtering was chosen. The structure of the installation and arrangements has already been described (Dr. E. Bergmann, Dr. J. Vogel; J. Vac. Sc. Techn. A5 (1987) page 70).

As cathode material an aluminum bronze of the following composition in percentage weight was used:
Aluminum 78.8%, tin 20%, silicon 1.2%.

The coating conditions were as follows: installation pressure 1.2 Pa, sputtering power 4×18 kW, partial pressure of oxygen 0.06 Pa.

Through the addition of oxygen the hardness was doubled to $HV_{0.1}=300$. The compressor screws coated in this manner showed an operating life of 40 hours under the same conditions as the uncoated ones.

While specific embodiments of the invention have been shown and described in detail to illustrate the application of the principles of the invention, it will be understood that the invention may be embodied otherwise without departing from such principles.

What is claimed is:

1. A method for producing a rolling element part to be subjected to rolling wear comprising:
    forming a rolling element body with a contact surface, the formed body surface having surface irregularities;
    smoothing said contact surface to reduce the surface irregularities;
    applying a coating on the smoothed surface by physical vapor deposition; the coating consisting of an alloy matrix containing at least one of the elements aluminum, chromium, nickel, magnesium, copper and metallic particles embedded in the matrix, said particles containing at least one of the elements tin, lead, indium and zinc; applying the coating in a thickness of 0.2 to 4 times the vertical height of the reduced surface irregularities, remaining after said smoothing.

2. A method according to claim 1, wherein said structural machine element body is formed of case-hardened steel and said contact surface is contour ground, the coating being applied in a thickness of 0.2 to 4 times the vertical height of the surface irregularities, remaining after the contour grinding.

3. A method for producing a rolling element part to be subjected to rolling wear comprising:
    forming a structural machine element body of chrome steel with a contact surface, the formed contact surface having surface irregularities;
    tempering said body at a tempering temperature and polishing said contact surface irregularities whereby the vertical height of the irregularities are in the submicrometer region; applying a coating on the polished contact surface by physical vapor deposition, the coating consisting of an alloy matrix containing at least one of the elements aluminum, chromium, nickel, magnesium, and copper and metallic particles embedded in the matrix, said embedded metallic particles being selected to have a melting point which is lower than said tempering temperature, the coating being applied in a thickness of 0.2 to 4 times the vertical height of the surface irregularities, remaining after said polishing.

4. A rolling element part subjected to rolling wear comprising a body with a contact surface and a coating on said contact surface, said contact surface having a smooth surface finish including surface irregularities remaining from a smoothing process, said coating being applied on the smoothed contact surface by physical vapor deposition and consisting of an alloy matrix containing at least one of the elements aluminum, chromium, nickel, magnesium, copper and metallic particles embedded in the matrix, said particles containing at least one of the elements tin, lead, indium and zinc, the coating having a thickness of 0.2 to 4 times the vertical height of said irregularities remaining from the smoothing process on said contact surface.

5. A rolling element part according to claim 4, wherein said coating is formed by at least two phases, a first phase forming a matrix firmly joined to the rolling elements body and a second phase providing an embedded material, the melting point of the embedded material being lower than the temperature at which a substantial change of mechanical properties occurs in the rolling element body.

6. A rolling element part according to claim 5, wherein: the rolling element body comprises steel, said embedded material having a melting point which lies below the tempering temperature of a shell of the rolling element body.

7. A rolling element part according to claim 5, wherein:
    said element body comprises steel having a surface-hardened edge zone, said embedded material having a melting point which lies below the tempering temperature of the surface-hardened edge zone of the rolling element body.

8. A rolling element part according to claim 5, wherein:
    said matrix contains an alloy, said alloy including aluminum, chromium, nickel, magnesium and copper, a component of the embedded material containing at least one of the tin, lead, indium and zinc.

9. A rolling element according to claim 5, wherein: said embedded material includes particles having a diameter X, said embedded material particles having a statistical normal distribution with a mean value of X, less than or equal 0.8 μm.

10. A rolling element part according to claim 9, wherein:
the coating has a gradient of hardness obtained by one of changing the ratio of the alloy elements, changing the mean particle diameter of the embedded material particles and embedding oxide, carbides and borides, or silicides of the matrix material with different concentrations.

11. A rolling element part according to claim 4, further comprising: a plurality of friction bearing material coatings.

12. A rolling element part according to claim 4, wherein: the coating has a thickness of 0.5–15 μm.

13. A rolling element part according to claim 4, wherein: said rolling element part is formed as a gear wheel.

14. A rolling element part according to claim 4, wherein:
said rolling element part is formed as a rolling bearing.

15. A rolling element part according to claim 4, wherein:
said rolling element part is formed as a shaft.

16. A rolling element part according to claim 4, wherein:
said rolling element part is formed as a compressor screw.

17. A rolling element part according to claim 4, wherein:
said rolling element part is formed as a rolling piston.

18. A rolling element part according to claim 4, wherein
said structural machine element part is formed as a rotary piston.

19. A rolling element part subjected to rolling wear comprising a tempered steel body with a contact surface and a coating on said contact surface, said contact surface having a smooth surface finish including surface irregularities remaining from a smoothing process, said coating being applied on the smoothed contact surface by physical vapor deposition and consisting of an alloy matrix containing at least one of the elements aluminum, chromium, nickel, magnesium, copper and metallic particles embedded in the matrix, said embedded metallic particles having a melting point which is lower than the tempering temperature of said tempered steel body, the coating having a thickness of 0.2 to 4 times the vertical height of said irregularities remaining from the smooth process on said contact surface.

* * * * *